(12) United States Patent
Duan

(10) Patent No.: US 7,583,209 B1
(45) Date of Patent: Sep. 1, 2009

(54) SYSTEM AND METHOD FOR SIGNALING ON A BUS USING FORBIDDEN PATTERN FREE CODES

(75) Inventor: Chunjie Duan, Medfield, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 12/051,192

(22) Filed: Mar. 19, 2008

(51) Int. Cl.
*H03M 7/00* (2006.01)
(52) U.S. Cl. .......................................... 341/80; 341/50
(58) Field of Classification Search .................. 341/80, 341/50; 714/781; 716/5; 725/127
See application file for complete search history.

(56) References Cited

U.S. PATENT DOCUMENTS

2007/0271535 A1* 11/2007 Hwang et al. .................. 716/5
2008/0086560 A1* 4/2008 Monier et al. ............... 709/224

* cited by examiner

*Primary Examiner*—Rexford N Barnie
*Assistant Examiner*—Joseph Lauture
(74) *Attorney, Agent, or Firm*—Dirk Brinkman; Gene Vinokur

(57) ABSTRACT

Embodiments of our invention describe the method for producing forbidden pattern free (FPF) codewords using an encoder-decoder (CODEC). First, the method encodes a dataword to produce a FPF codeword by mapping dataword to a Fibonacci Numeral System space. Further, the FPF codeword is transmitted via adjacent lines of a bus and decoded when received from the bus to recover the dataword to eliminate all crosstalk on the bus.

15 Claims, 7 Drawing Sheets

| Near-optimal FPF-CAC pseudo code |
|---|
| FPF-CAC($v$) |
| \\ MSB stage: |
| if $v \geq f_{m+1}$ then |
|     $d_m = 1$; |
|     $r_m = v - f_m$; |
| else |
|     $d_m = 0$; |
|     $r_m = v$; |
| end if |
| \\ other stages: |
| for k = m-1 to 2 do |
|     if $r_{k+1} \geq f_{k+1}$ then |
|         $d_k = 1$; |
|     else if $r_{k+1} < f_k$ then |
|         $d_k = 0$; |
|     else |
|         $d_k = d_{k+1}$; |
|     end if |
|     $r_k = r_{k+1} - f_k \cdot d_k$; |
| end for |
| \\LSB |
| $d_1 = r_2$; |
| return $(d_m d_{m-1} \ldots d_1)$; |

Fig. 3
300

SYSTEM AND METHOD FOR SIGNALING ON A BUS USING FORBIDDEN PATTERN FREE CODES

FIELD OF THE INVENTION

This invention relates generally to signaling on a bus, and more particularly to encoders and decoders (CODECs) and a system and method for encoding and decoding using forbidden pattern free codes.

BACKGROUND OF THE INVENTION

Crosstalk in Busses

In circuits with long and wide global busses, interconnect delays often dominate signal delays. For example, in a Deep Sub-Micron (DSM) chip with very large scale integration (VLSI) processes, the performance of the bus based interconnect has become a bottleneck to the overall system performance.

The capacitive crosstalk, i.e., the crosstalk due to the coupling capacitance between adjacent wires in the bus, induces additional energy consumption and signal delay. Thus, the crosstalk limits the maximum bus speed and raises the total power consumption.

Crosstalk Classification

FIG. 2 shows an example on-chip bus subject to crosstalk. $C_L$ is a load capacitance seen by a driver of the $j^{th}$ bit, which includes receiver gate capacitance and wire-to-substrate parasitic capacitance. $C_I$ is the inter-wire coupling capacitance between the $j^{th}$ line and adjacent signal lines, i.e., $(j-1)^{th}$ and $(j+1)^{th}$ lines of the bus in FIG. 2.

The delay $\tau_j$ of the $j^{th}$ line in the bus is:

$$\tau_j = \mathrm{abs}(k \cdot C_L \cdot \Delta V_j + k \cdot C_I \Delta V_{j-1} + k \cdot C_I \Delta V_{j+1}), \quad (1)$$

where k is a constant determined by the driver strength and line resistance, $\Delta V_j$ is the voltage change on the $j^{th}$ wire and $\Delta V_{j,k} = \Delta V_j - \Delta V_k$ is a relative voltage change between the $j^{th}$ and the $k^{th}$ line.

Usually on-chip busses are full-swing binary busses, therefore the two output voltage levels are $V_{dd}$ and 0V, and hence 1. $\Delta V_j \in \{0, \pm V_{dd}\}$ and $\Delta V_{j,k} \in \{0, \pm V_{dd}, \pm 2 \cdot V_{dd}\}$.

Equation (1) can be written as:

$$\tau_j = k \cdot C_L \cdot V_{dd} \cdot \mathrm{abs}(\delta_j + \lambda \cdot \delta_{j,j-1} + \lambda \cdot \delta_{j,j+1}), \quad (2)$$

where $\lambda = C_I/C_L$ and $\delta_j \in \{0, 1\}$ is the normalized voltage change on $j^{th}$ line; $\delta_{j,j\pm 1} \in \{0, \pm 1, \pm 2\}$ is the normalized relative voltage change on $j^{th}$ line for the $(j+1)^{th}$ or for the $(j-1)^{th}$ line. The $\delta_j$ term corresponds to the intrinsic delay and the $\delta_{j,j\pm 1}$ term corresponds to the crosstalk induced delay. Because $\lambda \gg 1$, the $\delta_j$ has negligible contribution to the delay.

$C_{eff,j}$ is defined as the effective total capacitance of the driver of $j^{th}$ line $$C_{eff,j} = C_L \cdot \mathrm{abs}(\delta_j + \lambda \cdot \delta_{j,j-1} + \lambda \cdot \delta_{j,j+1}), \quad (3)$$

Equation (2) can be rewritten as $$\tau_j = k \cdot V_{dd} \cdot C_{eff,j} \quad (4)$$

Equation (3) demonstrates that $\min(C_{eff,j}) = C_L$ and $\max(C_{eff,j}) = (1 + 4 \cdot \lambda) C_L$.

Crosstalk patterns are classified as 0C, 1C, 2C, 3C and 4C patterns respectively as shown in the first column of Table I. The middle column is $C_{eff}$, and the last column in Table I describes example transition patterns on three adjacent bits $b_{j+1}, b_j, b_{j-1}$ of the bus.

TABLE I

| class | $C_{eff}$ | transition patterns |
|---|---|---|
| 0C | $C_L$ | 000 → 111 |
| 1C | $C_L (1 + \lambda)$ | 011 → 000 |
| 2C | $C_L (1 + 2\lambda)$ | 010 → 000 |
| 3C | $C_L (1 + 3\lambda)$ | 010 → 100 |
| 4C | $C_L (1 + 4\lambda)$ | 010 → 101 |

The speed of the data bus is determined by $\max\{C_{eff,j}\}$ over all lines or bits of a bus j. By eliminating the 4C class of crosstalk on all lines of the bus, the maximum speed of the bus is increased by ~33%. By eliminating the transition patterns for the 3C and 4C classes, the maximum speed of the bus is increased by ~100%.

Conventional Methods for Reducing Crosstalk

There are number of conventional methods for reducing the crosstalk.

Passive Shielding

A passive shielding method for reducing crosstalk inserts passive shield, e.g., grounded wires, between adjacent active data wires. This method can reduce crosstalk-induced bus delay by nearly 50% and consequently boost the bus speed by nearly 100%. However, the passive shielding increases the size of the circuit.

Active Shielding

An active shielding method inserts shielding wires between data wires. The shielding wires, transition in the same direction as the data wire being shielded. In a simple case of active shielding, each data bit is transmitted on three wires. On the receiver side, only the wire in the middle is used to recover the data. The other two wires are used as shielding wires. Active shielding is a more aggressive and reduces the bus delay by up to 75%, however, it also increases the size of the circuit.

Physical Layout

The crosstalk can also be reduced by adjusting the dimensions of the bus, including the wire width, depth and spacing between wires. Such method incurs a large overhead and is susceptible to process variation.

Intentional Data Skewing

Intentional data skewing reduces crosstalk by intentionally introducing time offset on transitions of the data bits in a bus. Such method requires very tedious physical layout manipulation and is also susceptible to process variation.

Crosstalk Avoidance Codes

When special type of codes or codewords transmitted on the bus, certain classes of crosstalk are eliminated. Those codes are commonly referred to as Crosstalk Avoidance Codes (CACs).

Bus encoding methods encode the original datawords to CAC codewords and then transmit them on the bus. Those methods can achieve the same degree of bus delay reduction as the passive shielding methods with lower area overhead.

CACs can be memory-less or memory-based. The memory-based CACs use a codeword based on a previously transmitted codeword and the current transmitted codeword. On the receiver side, the codeword recovery is based on the current and previous codewords. The memory-less CACs use a fixed codebook to generate a codeword to transmit solely based on input data. The receiver uses the current codeword as the only input to recover the input data.

A CODEC is a device or program capable of performing encoding and decoding on a digital data stream or signal. The area overhead for memory-based CACs can be lower compared to memory-less CACs. However, the CODEC for the memory-based CACs are much more complex than the memory-less CACs.

Forbidden Pattern Free Code

A forbidden pattern free code is a memory-less code and can be used for crosstalk avoidance in bus interconnects. It offers the same amount of delay reduction as the passive shielding methods with less area overhead. The conventional CODECs are based on bus partitioning and brute-force logic optimization, which partitions a wide bus into a number of small groups (lanes) and applies CAC coding on each group independently. Those methods deal with the crosstalk across the group boundaries.

In all those methods, more than the required minimal number of wires is needed in the bus, and therefore the overall area overhead is higher than the theoretical lower bound. That leads to non-optimal area overhead and overall power consumption. It is desired to have a CODEC that can be implemented efficiently and operate at high data transfer speed.

SUMMARY OF THE INVENTION

The embodiments of the invention provide encoding data on busses using forbidden pattern free (FPF) code. The design is based on the Fibonacci numeral system (FNS). The embodiments of the invention enable constructing CODECs with large buses as a simple extension of CODECs with small buses.

The CODEC with the busses according to the embodiments of the invention offer an optimal or near-optimal area overhead performance and high efficiency in both circuit complexity and speed. The CODEC also allow an efficient and high speed implementation and therefore enable the FPF code to be used for on-chip bus crosstalk avoidance, and bus speed improvement and energy consumption reduction.

Although the embodiments of the invention are described for CODEC busses, it should be understood that the invention can be used for any high-speed, on-chip bus.

BRIEF DESCRIPTION OF THE DRAWINGS

FIG. 3 is pseudo code for the near-optimal FPF-CAC coding method that encodes a binary vector to an FPF Fibonacci vector according to the embodiments of the invention;

DETAILED DESCRIPTION OF THE PREFERRED EMBODIMENT

System Overview

Figure 1:
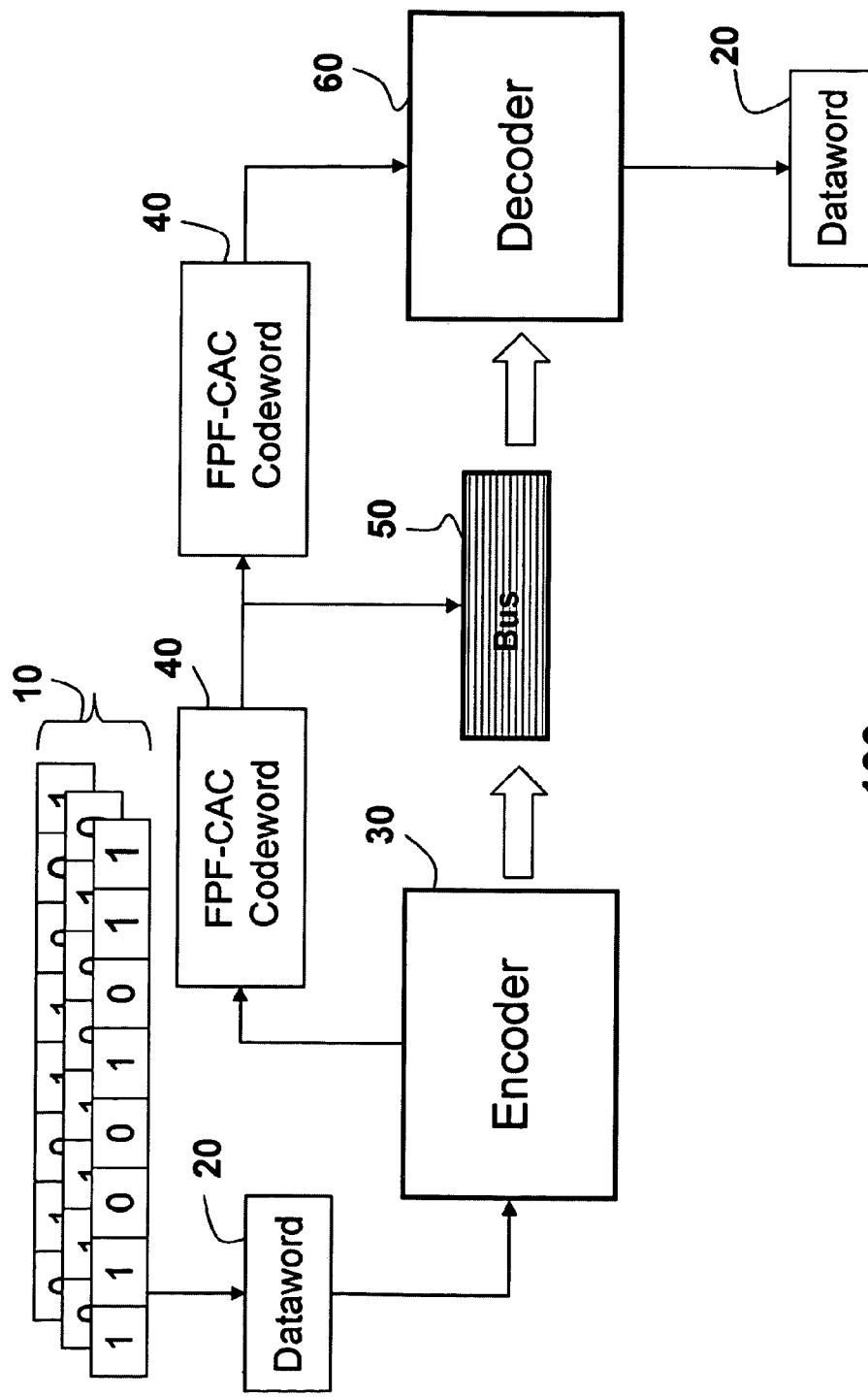
FIG. 1 is a block diagram of a method and a system for reducing crosstalk on busses according to the embodiments of our invention.
Figure 2:
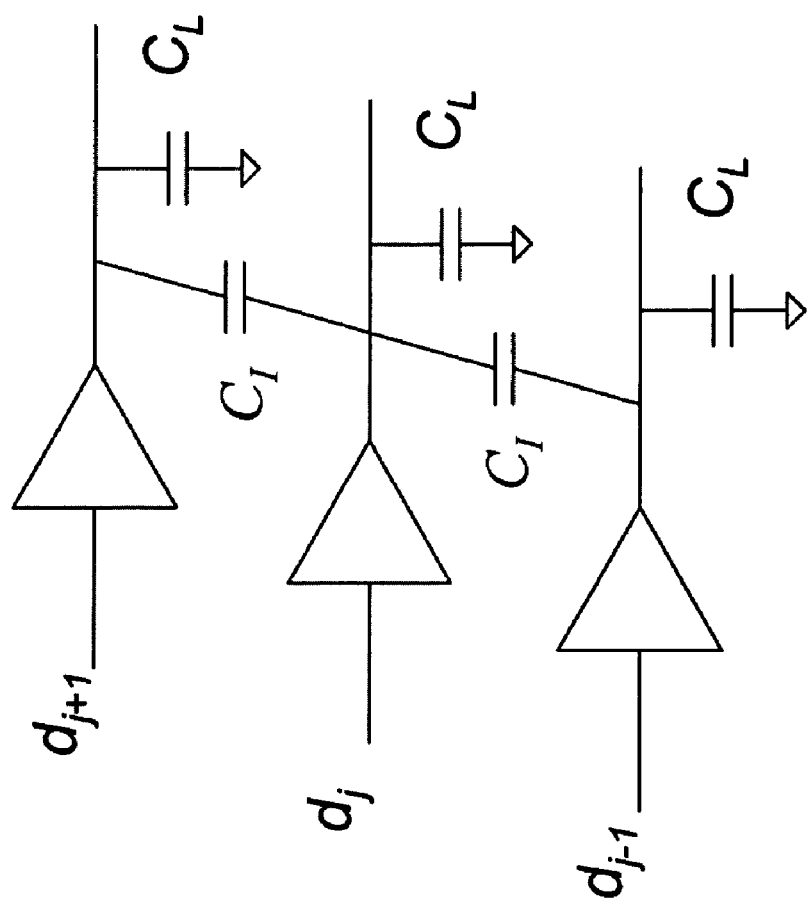
FIG. 2 is a schematic of on-chip bus with crosstalk.

FIG. 1 shows a method and a system 100 for reducing crosstalk in on-chip busses. The bus of the preferred embodiment of the invention is describe for a CODEC. However, it is understood that the invention can be used with any high-speed bus. A CODEC encodes 30 a current dataword 20 of a sequence of datawords 10 into Fibonacci-based forbidden patterns based crosstalk avoidance code (FPF-CAC) codeword 40. The codeword is transmitted over a bus 50. The codeword 40 is decoded 60 to recover the dataword 20. The dataword 20 is an input and an output of the method and the system 100. As described below, there is at least one m-bit Fibonacci "forbidden pattern" free codeword 40 that represents the dataword 20.

Forbidden Pattern Free (FPF) Code

Forbidden patterns are defined as two three-bit binary patterns: "101" and "010". An m-bit code is forbidden pattern free if none of the three consecutive bits in the code has a forbidden pattern. Such a code is defined as forbidden pattern free (FPF) code. As an example, 011000 is a 7-bit FPF code while 010000 and 011101 are not FPF codes.

When only FPF codewords are transmitted on a bus, the maximum crosstalk on any wire at any transition time is reduced by about half. Therefore, by encoding the datawords to FPF codewords, our invention speeds up the bus by ~100%. This type of code is referred herein as forbidden pattern free crosstalk avoidance code (FPF-CAC), see C. Duan et al. "Analysis and Avoidance of Crosstalk in On-chip Bus," Hot-Interconnects, 2001, pp 133-138, incorporated herein by reference.

Fibonacci Sequence

The maximum cardinality of the m-bit FPF-CAC Code, $T_g(m)$, is $$T_g(m)=2f_{m+1} \qquad (5)$$

where $f_m$ is the $m^{th}$ element in the Fibonacci sequence. The Fibonacci Sequence $f_m$ is defined as $$f_m = \begin{cases} 0 & \text{if } m = 0, \\ 1 & \text{if } m = 1, \\ f_{m-1} + f_{m-2} & \text{if } m \geq 2. \end{cases} \qquad (6)$$

Another identity of the Fibonacci sequence is $$f_m = \sum_{k=1}^{m-2} f_k + 1 \qquad (7)$$

To encode an n-bit binary bus into FPF-CAC code, the minimum number of bits needed, $m_{opt}$, is the smallest integer m that satisfies Equation (8). We compute the lower bound of the area overhead OH(n), which is defined as a ratio between the additional area required for the coded bus and the area of uncoded bus.

$$n \leq \lfloor \log_2(2 \cdot f_{m+1}) \rfloor. \qquad (8)$$

$$OH(n) = \frac{m-n}{n} \qquad (9)$$

The golden ratio, $$\varphi = \lim_{k \to \infty} \frac{f_{k+1}}{f_k} = 1.618,$$

is an asymptotic ratio of two consecutive elements of the Fibonacci sequence. Hence, $\lim_{k \to \infty} f_k = c\phi^k$, where c is a constant. Therefore, for wide busses, the lower bound of the, overhead is:

$$OH(n) \geq \frac{1}{\log_2 \varphi} - 1 \approx 44\%. \qquad (10)$$

Fibonacci-Based Numeral System

A numeral system is "a framework where numbers are represented by numerals in a consistent manner." A commonly used numeral system in digital circuits is the binary numeral system, which uses powers of two as a base. A binary numeral system is defined by Equation (11). The binary numeral system is complete and unambiguous, which means that each number v has one and only one representation in this binary numeral system.

$$v = \sum_{k=1}^{n} b_k \cdot 2^{k-1}, \qquad (11)$$

where k is the bit position and $b_k$ is a binary value of the $k^{th}$ bit.

The Fibonacci-based numeral system $N(F_m, \{0, 1\})$ is the numeral system that uses Fibonacci sequence as the base. A number v is represented as the summation of some Fibonacci numbers and no Fibonacci number is in the summation more that once as defined in Equation (12).

$$v = \sum_{k=1}^{n} d_k \cdot f_k \qquad (12)$$

The Fibonacci-based numeral system is complete but ambiguous. For example, there are six 7-digit vectors in the Fibonacci numeral system for the decimal number 19:

{0111101, 0111110, 10001101, 1001110, 10100001, 1010010}.

As defined herein, a vector in the binary numeral system is a binary vector or binary code; and a vector in the Fibonacci numeral system is a Fibonacci vector, Fibonacci codeword or Fibonacci code. All the Fibonacci vectors that represent the same number are equivalent vectors.

From Equation (7), we derive the range of m-bit Fibonacci vector as:

$$v \in [0, f_{m+2}). \qquad (13)$$

The total number of distinct values can be represented using m-bit Fibonacci vector is $$T_{gN}(m) = f_{m+2} \qquad (14)$$

CODEC with Forbidden Pattern Free Codes

The embodiments of our invention describe coding methods for encoding data to the FPF code. The coding methods enable systematical design of the FPF CODECs for busses of arbitrary sizes, such that the CODEC with a wide bus can be derived from the CODEC of a narrow bus. The relationship between number of gates and the bus increase is quadratic in the CODEC implementation according to the embodiments of our invention. For comparison, in the conventional coding methods this relationship is exponential. The coding methods of our invention are based on the Fibonacci numeral system.

Mapping

Theorem 1: $\exists d_m d_{m-1} \ldots d_2 d_1 = v$, $d_m d_{m-1} \ldots d_2 d_1 \in N(F_m, \{0, 1\})$ and is FPF, $\forall v \in [0, f_{m+2}-1]$ Theorem 1 states that for any number $v \in [0, f_{m+2}-1]$, there exists at least one m-bit Fibonacci vector $d_m d_{m-1} \ldots d_2 d_1 = v$ that represents this number and is forbidden pattern free. The proof is described in the Appendix.

According to Theorem 1, we can design a CODEC that maps an input to its FPF Fibonacci vector.

Near Optimal FPF CODEC

The embodiments of our invention describe the coding method that converts an input dataword to a FPF Fibonacci code. The Fibonacci code is near-optimal because the required overhead is no more than one bit greater than the theoretical lower bound described in Equation (10).

In a preferred embodiment of our invention, the encoder converts an input dataword value represented in the numeral system to the Fibonacci numeral system representation. The output of the encoder is guaranteed to be a valid FPF codeword.

Encoding

Figure 4:
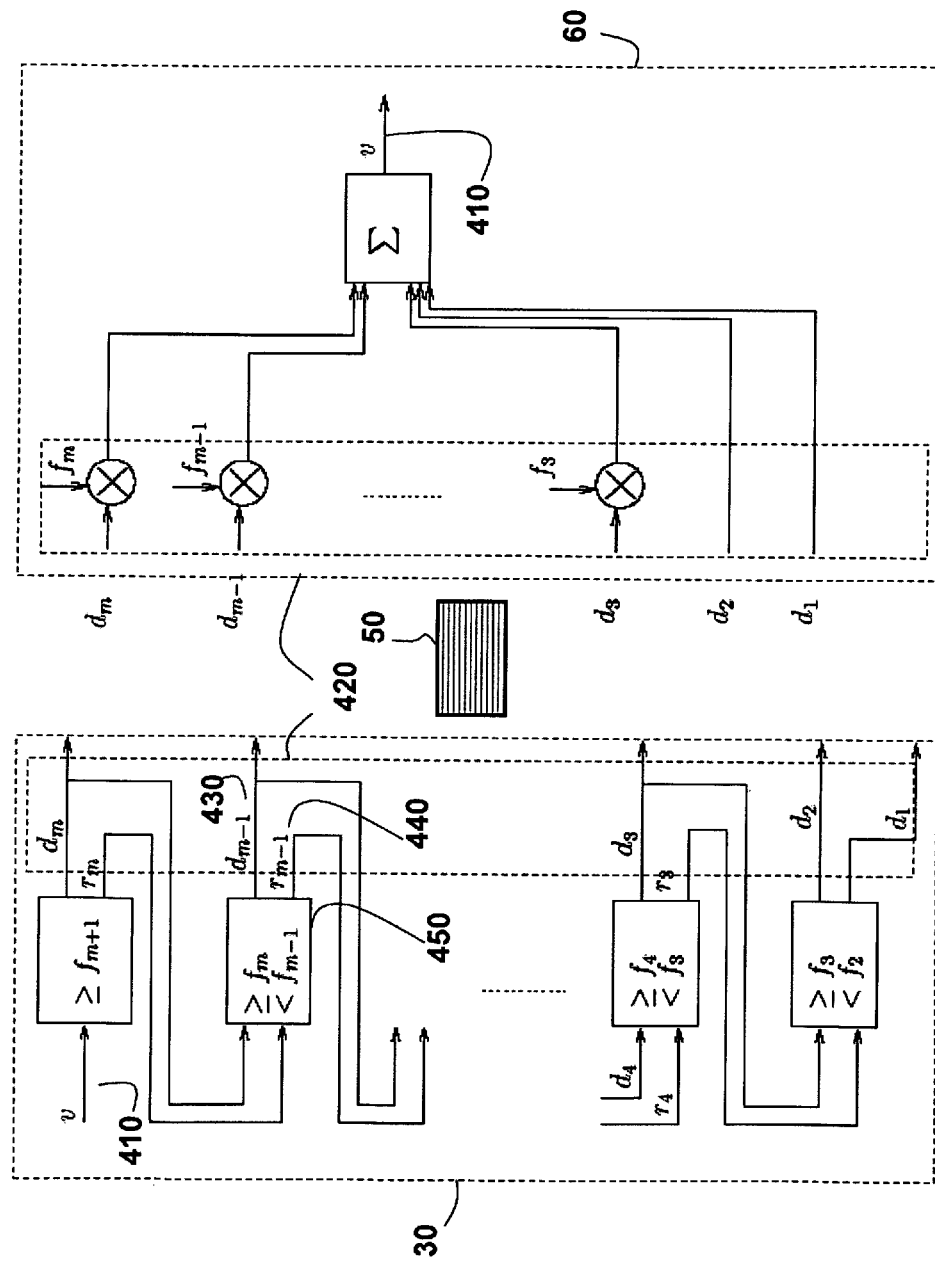
FIG. 4A is a block diagram for an encoder implementation based on the pseudo code of FIG. 3.
FIG. 4B is a block diagram of the decoder implementation for the near-optimal FPF code decoding operation according to the embodiments of the invention.

FIG. 3 shows the pseudo code 300 for the near-optimal FPF-CAC coding method that encodes a number v to an FPF Fibonacci vector (code). FIG. 4A shows an implementation of the encoder 30 based on the near-optimal FPF-CAC pseudo code 300 according to one embodiment of our invention. The encoder 30 converts a n-bit binary vector 410 v=

Figure 5:
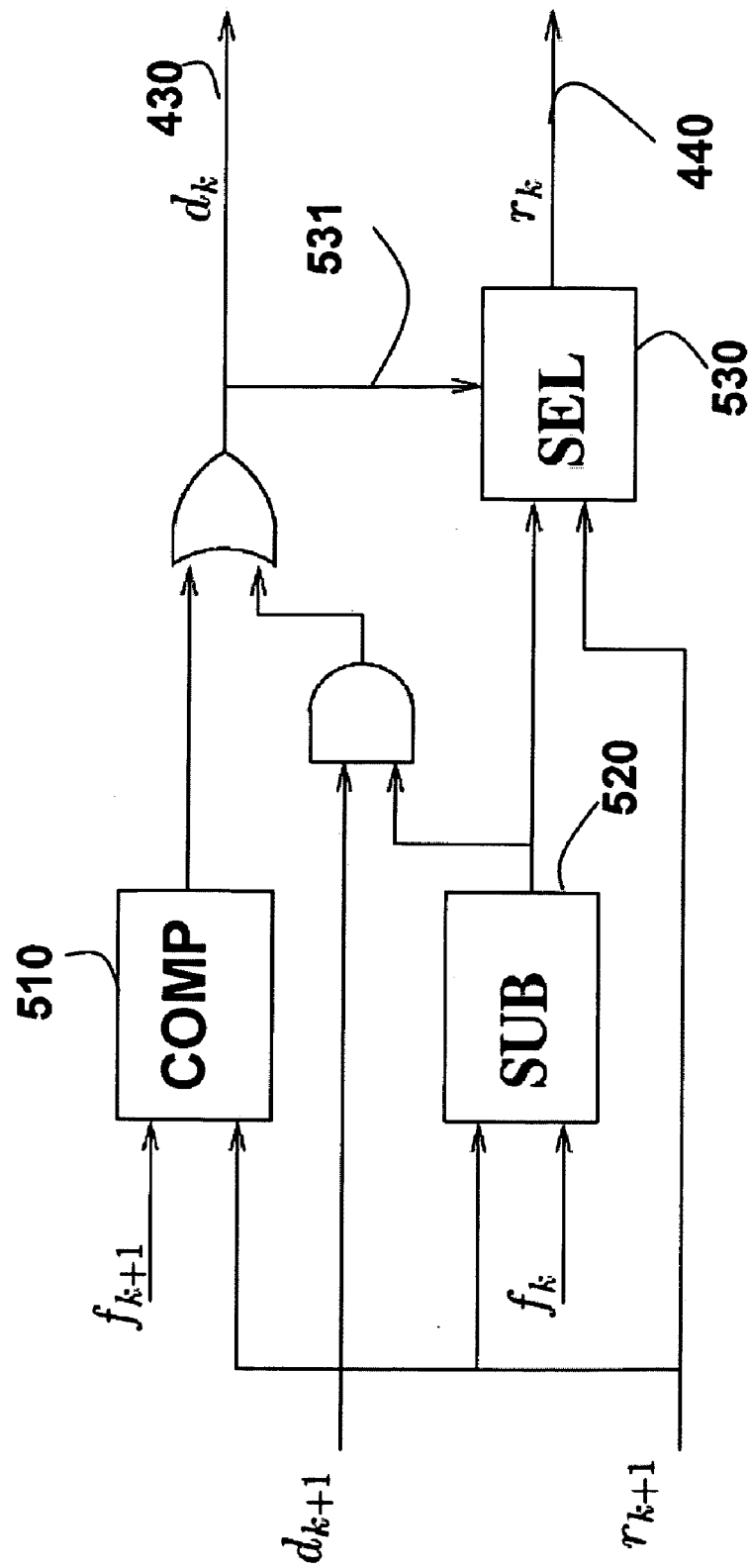
FIG. 5 is a block diagram of an implementation of one stage of the encoder operation according to the embodiments of the invention.

$b_{n-1} \ldots b_0$ to an m-bit FPF Fibonacci vector 420 $d_{m-1}d_{m-2} \ldots d_0$. The logical structure of the encoder 30 can be described as:

1. The encoder comprises m−1 stages;
2. Each stage of the encoder produces one coded bit, e.g., the $k^{th}$ stage produces $d_k$ 430;
3. Each stage generates a remainder $r_k$ 440;
4. The remainder $r_k$ 440 of a stage is the input to the following stage k−1, i.e., for the $k^{th}$ stage, the inputs are $d_{k+1}$ and $r_{k+1}$ and the outputs are $d_k$ and $r_k$, wherein $d_k$ is one bit of the output Fibonacci vector 520 and $r_k$ is the remainder of input vector v 510 that is the input to the following stage.
5. In each stage k, i.e., any stage except the most significant bit (MSB) stage, the input $r_{k+1}$ is compared 450 to two corresponding consecutive elements of the Fibonacci sequence $f_{k+1}$ and $f_k$. If $r_{k+1} \geq f_{k+1}$, $d_k=1$; If $r_{k+1}<f_k$, $d_k=0$; otherwise, $d_k=d_{k+1}$;
6. The input of the MSB stage is the input to the CODEC, $v=b_n b_{n-1} \ldots b_1$;
7. The logic of the MSB stage can be either
   If $v \geq f_{k+1}$, $d_k=1$; otherwise $d_k=0$; or
   If $v<f_k$, $d_k=0$; otherwise $d_k=1$;

FIG. 5 shows an implementation of the $k^{th}$ stage of the encoder, where k<m. There is one comparator 510 for comparison operation 450, one subtractor 520 and a 2-to-1 selector 530 that selects according select line 531.

Decoding

FIG. 4B shows a decoder 60 for the near-optimal FPF code decoding operation. The decoder 60 converts codeword 420 transmitted on the bus 50 in Fibonacci numeral system back to the dataword 410 in original numeral system, e.g., in the binary format. In an embodiment of our invention, the decoding process is based on Equation (12).

Table III shows the complete 6-bit codewords generated using the near-optimal FPF-CAC pseudo code in column CODE-1.

As described above, the MSB stage is different from other stages because there is no preceding bit. For the values in the gray region, i.e., the region where duplicated FPF Fibonacci vectors exist, $d_{m-1}$ can be coded to be either value. In the near-optimal FPF-CAC pseudo code, we arbitrarily choose to code the MSB ($d_m$) to be 0 when the input value is in the gray zone of the $m^{th}$ stage, where gray zone of the $k^{th}$ stage is defined as the region of $[f_{k-1}, f_k)$.

If we code $d_m$ to be 1 for all values in the gray zone, then a different set of codewords is listed in CODE-2 column of the Table III. All codewords in both CODE-1 and CODE-2 columns of Table III are FPF. For clarity, we only list codewords in CODE-2 that are different from codewords in CODE-1.

TABLE III

| Input Decimal value | CODE-1 | | | | | | CODE-2 | | | | | |
|---|---|---|---|---|---|---|---|---|---|---|---|---|
| | $f_6$ | $f_5$ | $f_4$ | $f_3$ | $f_2$ | $f_1$ | $f_6$ | $f_5$ | $f_4$ | $f_3$ | $f_2$ | $f_1$ |
| | 8 | 5 | 3 | 2 | 1 | 1 | 8 | 5 | 3 | 2 | 1 | 1 |
| 20* | 1 | 1 | 1 | 1 | 1 | 1 | | | | | | |
| 19* | 1 | 1 | 1 | 1 | 1 | 0 | | | | | | |
| 18* | 1 | 1 | 1 | 1 | 0 | 0 | | | | | | |
| 17* | 1 | 1 | 1 | 0 | 0 | 1 | | | | | | |
| 16* | 1 | 1 | 1 | 0 | 0 | 0 | | | | | | |
| 15 | 1 | 1 | 0 | 0 | 1 | 1 | | | | | | |
| 14 | 1 | 1 | 0 | 0 | 0 | 1 | | | | | | |
| 13 | 1 | 1 | 0 | 0 | 0 | 0 | | | | | | |
| 12 | 0 | 1 | 1 | 1 | 1 | 1 | 1 | 0 | 0 | 1 | 1 | 1 |
| 11 | 0 | 1 | 1 | 1 | 1 | 0 | 1 | 0 | 0 | 1 | 1 | 0 |
| 10 | 0 | 1 | 1 | 1 | 0 | 0 | 1 | 0 | 0 | 0 | 1 | 1 |
| 9 | 0 | 1 | 1 | 0 | 0 | 1 | 1 | 0 | 0 | 0 | 0 | 1 |
| 8 | 0 | 1 | 1 | 0 | 0 | 0 | 1 | 0 | 0 | 0 | 0 | 0 |
| 7 | 0 | 0 | 1 | 1 | 1 | 1 | | | | | | |
| 6 | 0 | 0 | 1 | 1 | 1 | 0 | | | | | | |
| 5 | 0 | 0 | 1 | 1 | 0 | 0 | | | | | | |
| 4 | 0 | 0 | 0 | 1 | 1 | 1 | | | | | | |
| 3 | 0 | 0 | 0 | 1 | 1 | 0 | | | | | | |
| 2 | 0 | 0 | 0 | 0 | 1 | 1 | | | | | | |
| 1 | 0 | 0 | 0 | 0 | 0 | 1 | | | | | | |
| 0 | 0 | 0 | 0 | 0 | 0 | 0 | | | | | | |

Based on Equation (14), we determine that the total numbers of codewords in both CODE-1 and CODE-2 are $f_{m+2}$, which is slightly smaller than the maximum cardinality of $2f_{m+1}$ of Equation (5). The coding methods described above require that the number of bits needed for the CODEC is no more than 1 bit greater than the minimum required number of bits $m_{opt}$. This is because $T_{gN}(m)=f_{m+2}$, $T_g(m)=2f_{m+1}$, $T_{gN}(m+1)=f_{m+3}$ and $f_{m+2}<2 \cdot f_{m+1}<f_{m+3}$.

Table IV shows the number of bits needed to encode the binary data from 3 to 32 bits: n denotes the number of bits for the input binary bus; $m_{opt}$ the number of bits required for the optimal code; $m_{no}$ the number of bits needed for the CODEC and $\Delta(m)$ the difference between the two.

TABLE IV

| $n_{in}$ | $m_{opt}$ | $m_{no}$ | $\Delta(m)$ |
|---|---|---|---|
| 3 | 4 | 4 | 0 |
| 4 | 5 | 6 | 1 |
| 5 | 7 | 7 | 0 |
| 6 | 8 | 9 | 1 |
| 7 | 10 | 10 | 0 |
| 8 | 11 | 12 | 1 |
| 9 | 13 | 13 | 0 |
| 10 | 14 | 15 | 1 |
| 11 | 16 | 16 | 0 |
| 12 | 17 | 17 | 0 |
| 13 | 18 | 19 | 1 |
| 14 | 20 | 20 | 0 |
| 15 | 21 | 22 | 1 |
| 16 | 23 | 23 | 0 |
| 17 | 23 | 23 | 1 |
| 18 | 26 | 26 | 0 |
| 19 | 27 | 28 | 1 |
| 20 | 29 | 29 | 0 |
| 21 | 30 | 30 | 0 |
| 22 | 31 | 32 | 1 |
| 23 | 33 | 33 | 0 |
| 24 | 34 | 35 | 1 |
| 25 | 36 | 36 | 0 |
| 26 | 37 | 38 | 1 |
| 27 | 39 | 39 | 0 |
| 28 | 40 | 41 | 1 |
| 29 | 42 | 42 | 0 |
| 30 | 43 | 43 | 0 |
| 31 | 44 | 45 | 1 |
| 32 | 46 | 46 | 0 |

Optimal CODEC

The described above mapping scheme for the near-optimal CODEC can be modified to achieve optimal overhead performance. Such a CODEC is referred herein as the 'Optimal CODEC'.

Table III shows that there are a total of $(f_{m+1}-f_m)$ codewords in CODE-2 that are not included in CODE-1. We define the region where duplicated FPF Fibonacci vectors exist as gray region. The total number of distinct codewords in both CODE-1 and CODE-2 is:

$$T_{gO}(m)=f_{m+2}+f_{m+1}-f_m=f_{m+1}+f_m+f_{m+1}-f_m=2 \cdot f_{m+1} \quad (15)$$

The reason that the near-optimal codes do not reach the maximum cardinality is due to the redundant FPF Fibonacci vectors for the values in the gray region. Table V shows that in one embodiment of our invention we remove this redundancy by moving the codewords in the CODE-2 gray region to the top of CODE-1.

TABLE V

| Input | XB | OPT ENC | | | | | | Encoder 2 | | | | | |
|---|---|---|---|---|---|---|---|---|---|---|---|---|---|
| | $f_7$ | $f_6$ | $f_5$ | $f_4$ | $f_3$ | $f_2$ | $f_1$ | $f_6$ | $f_5$ | $f_4$ | $f_3$ | $f_2$ | $f_1$ |
| Decimal value | 13 | 8 | 5 | 3 | 2 | 1 | 1 | 8 | 5 | 3 | 2 | 1 | 1 |
| 25* | 1 | 1 | 0 | 0 | 1 | 1 | 1 | | | | | | |
| 24* | 1 | 1 | 0 | 0 | 1 | 1 | 0 | | | | | | |
| 23* | 1 | 1 | 0 | 0 | 0 | 1 | 1 | | | | | | |
| 22* | 1 | 1 | 0 | 0 | 0 | 0 | 1 | | | | | | |
| 21* | 1 | 1 | 0 | 0 | 0 | 0 | 0 | | | | | | |
| 20* | 0 | 1 | 1 | 1 | 1 | 1 | 1 | | | | | | |
| 19* | 0 | 1 | 1 | 1 | 1 | 1 | 0 | | | | | | |
| 18* | 0 | 1 | 1 | 1 | 1 | 0 | 0 | | | | | | |
| 17* | 0 | 1 | 1 | 1 | 0 | 0 | 1 | | | | | | |
| 16* | 0 | 1 | 1 | 1 | 0 | 0 | 0 | | | | | | |
| 15 | 0 | 1 | 1 | 0 | 0 | 1 | 1 | | | | | | |
| 14 | 0 | 1 | 1 | 0 | 0 | 0 | 1 | | | | | | |
| 13 | 0 | 1 | 1 | 0 | 0 | 0 | 0 | | | | | | |
| 12 | 0 | 0 | 1 | 1 | 1 | 1 | 1 | 1 | 0 | 0 | 1 | 1 | 1 |
| 11 | 0 | 0 | 1 | 1 | 1 | 1 | 0 | 1 | 0 | 0 | 1 | 1 | 0 |
| 10 | 0 | 0 | 1 | 1 | 1 | 0 | 0 | 1 | 0 | 0 | 0 | 1 | 1 |
| 9 | 0 | 0 | 1 | 1 | 0 | 0 | 1 | 1 | 0 | 0 | 0 | 0 | 1 |
| 8 | 0 | 0 | 1 | 1 | 0 | 0 | 0 | 1 | 0 | 0 | 0 | 0 | 0 |
| 7 | 0 | 0 | 0 | 1 | 1 | 1 | 1 | | | | | | |
| 6 | 0 | 0 | 0 | 1 | 1 | 1 | 0 | | | | | | |
| 5 | 0 | 0 | 0 | 1 | 1 | 0 | 0 | | | | | | |
| 4 | 0 | 0 | 0 | 0 | 1 | 1 | 1 | | | | | | |
| 3 | 0 | 0 | 0 | 0 | 1 | 1 | 0 | | | | | | |
| 2 | 0 | 0 | 0 | 0 | 0 | 1 | 1 | | | | | | |
| 1 | 0 | 0 | 0 | 0 | 0 | 0 | 1 | | | | | | |
| 0 | 0 | 0 | 0 | 0 | 0 | 0 | 0 | | | | | | |

In order to remove the redundancy, we shift the values of these codewords by $f_{m+2}-f_m=f_{m+1}$. The MSB stage of the CODEC is modified to reflect this value shift in the new mapping scheme:

$$\begin{cases} d_m = 1, r_m = v, & \text{if } v \geq f_{m+2} \\ d_m = 1, r_m = v, & \text{if } f_{m+2} > v \geq f_{m+1} \\ d_m = 0, r_m = v, & \text{if } v < f_{m+1} \end{cases} \quad (16)$$

The decoder is modified accordingly:

$$v = \begin{cases} \sum_{k=0}^{m-1} d_k \cdot f_k + f_{m+1} & \text{if } b_m b_{m-1} = 10, \\ \sum_{k=0}^{m-1} d_k \cdot f_k & \text{otherwise} \end{cases} \quad (17)$$

Table V shows the codewords based on the optimal CODEC corresponding dataword value for each codeword. This mapping scheme can also be interpreted as the codewords having an extra bit as shown in the second column (XB) in the table V. This bit is not transmitted on the bus because its value can be recovered by the decoder based on the values of $d_m$ and $d_{m-1}$.

The overhead performance of the optimal coding scheme reaches the theoretical lower bound given in Equation (9). cl Optimization of the Near-Optimal Mapping Scheme The near-optimal mapping scheme can be modified to simplify the MSB stage. Let $b_n b_{n-1} \ldots b_1$ be the binary input vector, $d_m = b_n$ and $r_m = b_{n-1} b_{n-2} \ldots b_1$. The modified mapping can be expressed as $$v = b_n \cdot 2^{n-1} + \sum_{k=1}^{m-1} d_k \cdot f_k. \quad (18)$$

This modification allows the encoder to directly output the input MSB bit as the output MSB bit. The outputs are still guaranteed to be the FPF codes for the following reasons: because to code a n-bit binary code to an m-bit Fibonacci code, n and m satisfies: $2^n < f_{m+2}$ and we have $2^n \leq f_{m+2} < 2 \cdot f_{m+1}$, hence $$2^{n-1} < f_{m+1} \quad (19)$$

Equation (19) indicates that the n bit input binary data can be partitioned into the MSB bit and a (n−1) bit vector. The MSB bit is transmitted without coding and the n−1 bit vector is encoded into a m−1 bit bus.

Figure 6:
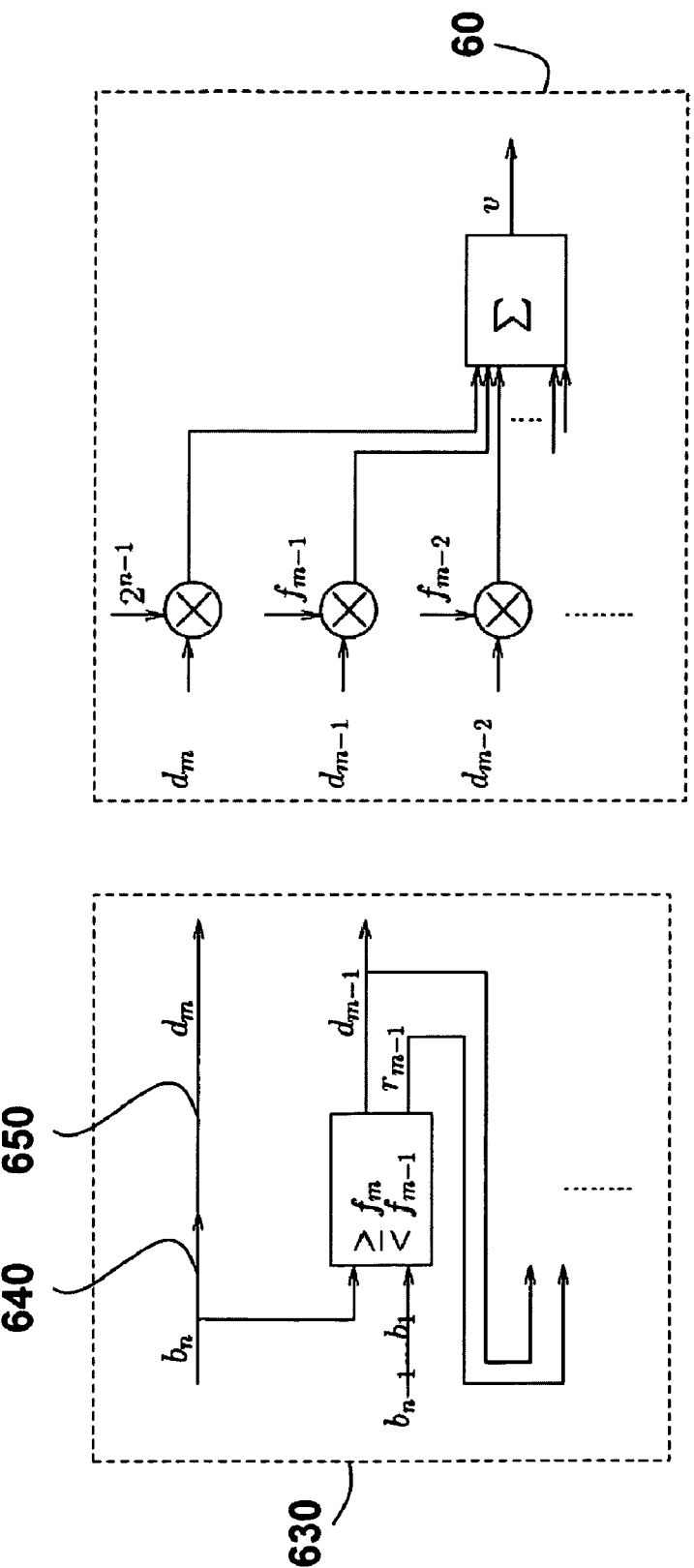
FIG. 6 is a block diagram of a modified CODEC with the simplified MSB stage according to the embodiments of the invention.

FIG. 6 shows a block diagram of the modified CODEC with the simplified MSB stage. In the encoder 630, the MSB of the input $b_n$ 640 is mapped directly to the MSB of the output $d_m$ 650. The remainder of the input vector $b_{n-1} b_{n-2} \ldots b_1$ becomes the input of the $(m-1)^{th}$ stage.

The decoder 660 for the modified coding scheme is implemented according to Equation (18), similar to the decoder 60 shown on FIG. 4B.

Bus Partitioning

Embodiments of our invention can be used in combination with bus partitioning to further reduce the overall complexity of the encoder and increase the speed of the encoder. Reducing partition by half can increase the bus speed by approximately a factor of four. Similarly, the total area of the CODEC circuit has the quadratic relation with respect to the number of input bits, and therefore partitioning the bus reduces the area by ~50%.

The structure of the decoder is simpler than the structure of the encoder and has no delay rippling effect. However, as the bus width increases, the size of the summation stage also increases, and an increased delay is experienced. In some embodiments of our invention, there are no multiplication and logical AND operations. Because $f_k$ is a constant, the case of connecting $d_k$ to the non-zero bit positions of $f_k$ is simplified.

Figure 7:
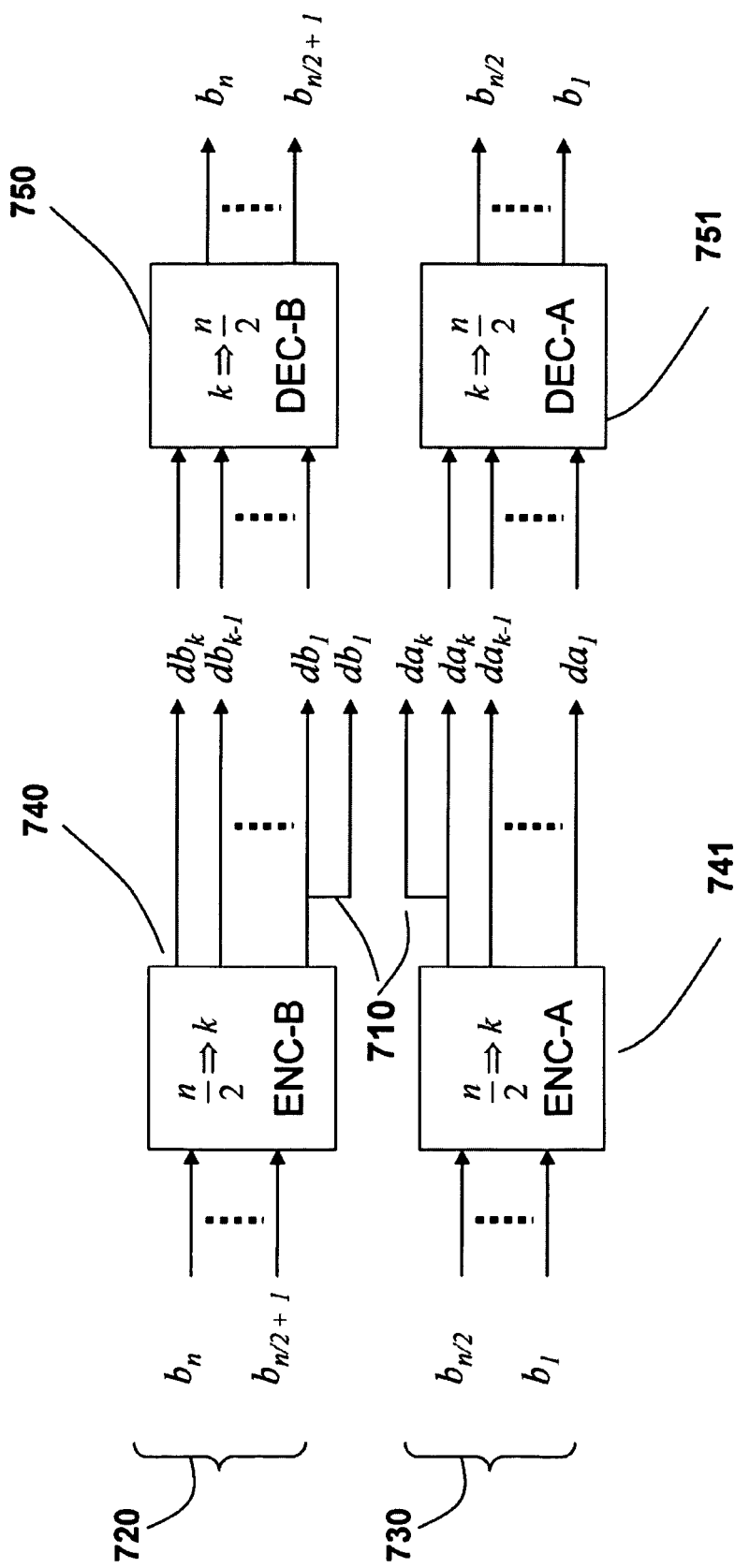
FIG. 7 is a block diagram of the CODEC for a partitioned into two groups input bus according to the embodiments of the inventions.

In the example shown in FIG. 7, a n-bit input bus, wherein n is an even number, is partitioned into two n/2-bit groups: $b_{n/2} \ldots b_1$ (group A) 730 and $b_n \ldots b_{n/2+1}$ (group B) 720. $b_{n/2} \ldots b_1$ 730 and $b_n \ldots b_{n/2+1}$ 720 are encoded 740 and 741 into two k-bit FPF busses, $da_k \ldots da_1$ and $db_k \ldots db_1$, where k satisfies $2f_{k+1} > 2^{n/2}$. Encoders for both group ENC-A 741 and ENC-B 740 are n/2-bit to k-bit encoders. Two k-bit to n/2-bit decoders DEC-A 751 and DEC-B 750 are used on the receiver side. That is, the encoding is performed independently for each group of lines.

The maximum delay of the encoders and decoders are $\tau_{enc}(n/2)$ and $\tau_{dec}(n/2)$, respectively, instead of $\tau_{enc}(n)$ and $\tau_{dec}(n)$. The gate count of the CODEC is reduced from GC(n) to $2 \cdot GC(^n{}_2)$. To prevent the occurrence of forbidden patterns across the group boundary, additional wires 710 are need on the bus. In the example in FIG. 7, $da_k$ and $db_1$ are duplicated so the bits in the bus at the group boundary are $\ldots db_1 db_1 da_k da_k da_{k-1} \ldots$

EFFECT OF THE INVENTION

The embodiments of the invention provide CODEC designs for forbidden-pattern-free crosstalk avoidance code (FPF-CAC). The mapping schemes are based on the representation of numbers in Fibonacci numeral system.

One embodiment of the invention offers near-optimal area overhead performance. Another embodiment of the invention offers an improved area overhead that reaches theoretical lower bound.

The described systems and methods enable CODECs for arbitrary bus sizes to be designed in a systematic fashion. With such a deterministic and systematic mapping, the construction of a CODEC with a wider bus is a simple extension of the CODEC for a smaller bus. The invented encoders have modularly structure, which allows the modules to be reusable.

We described the modifications to our near-optimal CODEC that reduces the complexity and improve the delay performance of the CODEC.

Although the invention has been described by way of examples of preferred embodiments, it is to be understood that various other adaptations and modifications may be made within the spirit and scope of the invention. Therefore, it is the object of the appended claims to cover all such variations and modifications as come within the true spirit and scope of the invention.

APPENDIX A

Proof of Theorem 1

Theorem 1:

$$\exists d_m d_{m-1} \ldots d_2 d_1 = v, \ d_m d_{m-1} \ldots d_2 d_1 \in N(F_m, \{0,1\}),$$
$$\forall v \in [0, f_{m+2} - 1]$$

In order to prove Theorem 1, we derive the following corollaries.

Corollary 1: The following two m-bit Fibonacci vectors are equivalent: $d_m d_{m-1} \ldots d_3 01$ and $d_m d_{m-1} \ldots d_3 10$. I.e., $d_m d_{m-1} \ldots d_3 01 \equiv d_m d_{m-1} \ldots d_3 10$.

Proof: Because $f_2 = f_1 = 1$, it is obvious that the last two digits are interchangeable.

Corollary 2: For an m-bit Fibonacci vector $d_m d_{m-1} \ldots d_2 d_1$, if three consecutive bits $d_k d_{k-1} d_k - 2$ have a value 100, replacing them with 011 produces an equivalent vector.

Proof: This is proven based on the definition of Fibonacci sequence given in Equation (17).

Corollary 3: For an m-bit Fibonacci vector $d_m d_{m-1} \ldots d_2 d_1$, if a number of consecutive bits (slice) in the vector $d_k d_{k-1} \ldots d_{k-n}$ have a pattern of 0101 $\ldots$ 0100, i.e., alternating 0 and 1 except the last two bits, replacing the slice with the pattern 0011 $\ldots$ 1111, i.e., all bits are 1 except the first two bits, produces an equivalent vector.

Proof: From the right to left, we can recursively replace 100 with 011 (Corollary 2) until $d_{k-1} d_{k-2} d_{k-3}$ has been replaced.

Corollary 4: For an m-bit Fibonacci vector $d_m d_{m-1} \ldots d_2 d_1$, if a slice in the vector $d_k d_{k-1} \ldots d_{k-n}$ have a pattern of 1010 $\ldots$ 1011, i.e., alternating 0 and 1 except the last two bits, replacing the slice with the pattern 1100 $\ldots$ 0000, i.e., first two bits are 1s and the other bits are 0s, produces an equivalent vector.

Proof: From the right to left, we can recursively replace 011 with 100 (Corollary 2) until $d_{k-1} d_{k-2} d_{k-3}$ has been replaced.

The proof of Theorem 1:
We first state the following:

$$\exists d_m d_{m-1} \ldots d_2 d_1 = v, \ d_m d_{m-1} \ldots d_2 d_1 \in N(F_m, \{0,1\}),$$
$$\forall v \in [0, f_{m+2} - 1].$$

In other words, for any number $v \in [0, f_{m+2} - 1]$, there exists at least one m-bit Fibonacci vector $d_m d_{m-1}$. This follows from the completeness of the Fibonacci number system. If the vector $d_m d_{m-1} \ldots d_2 d_1$ is not FPF, then we can produce at least one equivalent vector that is FPF by performing some or all of the following procedures.

If the vector ends with a forbidden pattern (101 or 010), then there exists an equivalent vector that ends with 110 or 001 (Corollary 1).

If any slice (a group of consecutive bits) in the vector contains forbidden pattern, then the slice can be replaced with a pattern that is forbidden pattern free using Corollary 3 and Corollary 4.

APPENDIX B

Proof of the Correctness of FTF Encoding Algorithm

Proof:
The correctness of the algorithm can be proven by demonstrating that if the partially generated output vector $d_m \ldots d_{k+1} d_k$ from the first k stages is FPF, adding the output of the $(k-1)^{th}$ stage, $d_{k-1}$ will not introduce a forbidden pattern.

If element $d_k = d_{k+1}$, no forbidden pattern will be produced regardless of the value of $d_{k-1}$. Therefore we only need to show that when $d_k \neq d_{k+1}$, $d_{k-1}$ will satisfy $d_{k-1} = d_k$. Based on Algorithm 2, $d_k \neq d_{k+1}$ occurs only when $d_k$ is forced to be 0 or 1. The proof is reduced to proving that when $d_k$ is forced to one particular value, $d_{k-1}$ will be coded the same value as $d_k$.

The following proves that if $d_k =$ is forced to be 1, $d_{k-1}$ will not be forced to be 0.

If $d_k = 1$ and $d_k \neq d_{k+1}$ [$d_k$ in force-1 zone]
$\Rightarrow r_{k+1} \geq f_{k+1}$ and $r_k = r_{k+1} - f_k$
$\Rightarrow r_k \geq f_{k+1} - f_k$
$\Rightarrow r_k \geq f_{k-1}$ [$d_{k-1}$ not in force-0 zone]
$\Rightarrow d_{k-1} = 1$ The following proves that if $d_k =$ is forced to be 0, $d_{k-1}$ will not be forced to be 1.

If $d_k = 0$ and $d_k \neq d_{k+1}$ [$d_k$ in force-0 zone]
$\Rightarrow r_{k+1} < f_{k+1}$ and $r_k = r_{k+1}$
$\Rightarrow r_k < f_k$ [$d_{k-1}$ not in force-1 zone]
$\Rightarrow d_{k-1} = 0$ Therefore, the encoding algorithm guarantees to produce an FPF code.

What is claimed is:

1. A method for reducing crosstalk in a bus comprising:
   encoding a dataword to produce a Fibonacci forbidden pattern free (FPF) codeword using a Fibonacci sequence;
   shifting values of the FPF codeword by $f_{m+1}$ to remove the values redundancy in a region where duplicated FPF Fibonacci vectors exist,
   transmitting the FPF codeword via a plurality of adjacent lines of a bus; and
   decoding the FPF codeword received from the bus to recover the dataword while eliminating crosstalk on all of the plurality of lines wherein fm is the $m^{th}$ element in the Fibonacci sequence.

2. The method of claim 1, further comprising:
   presenting the dataword in a binary numeral system and the FPF codeword in a Fibonacci numeral system.

3. The method of claim 1, wherein the encoding comprises of m−1 stages to produce the FPF codeword of a m-bit length, wherein an encoding for each stage k comprises:
   comparing a remainder input $r_{k+1}$ to a stage k with two corresponding consecutive elements $f_{k+1}$ and $f_k$ of the Fibonacci sequence;
   assigning a value of 1 to an output $d_k$ of the stage k, if $r_{k+1} \geq f_{k+1}$;
   assigning a value of 0 to the output $d_k$ of the stage k, if $r_{k+1} < f_k$; and otherwise
   assigning a value of an output $d_{k+1}$ of previous stage k+1 to the output $d_k$.

4. The method of claim 3, wherein the encoding for each stage k further comprises:
   sending the remainder $r_k$ of the encoding for the stage k as an input to a following stage k−1.

5. The method of claim 3, wherein the output $d_k$ of a most significant bit stage k is 0.

6. The method of claim 3, wherein the output $d_k$ of a most significant bit stage k is 1.

7. The method of claim 3, wherein the output $d_k$ of a most significant bit stage k equals to a most significant bit of the dataword.

8. The method of claim 1, further comprising:
   partitioning the plurality of lines of the bus into a set of groups of lines;
   applying the encoding step independently to each group of lines in the set.

9. A method for encoding a dataword to a codeword, comprising:
   converting a dataword into a set of codewords, in which each codeword is represented by a Fibonacci numeral system;
   selecting a Fibonacci forbidden pattern free (FPF) codeword from the set of codewords;
   shifting values of the FPF codeword by $f_{m+1}$ to remove the values redundancy in a region where duplicated FPF Fibonacci vectors exist;
   representing the dataword as an encoded FPF codeword; and
   transmitting the FPF codeword via a plurality of adjacent lines of a bus while eliminating crosstalk on all of the plurality of lines wherein fm is the $m^{th}$ element in the Fibonacci sequence.

10. The method of claim 9, wherein the converting step and the selecting step are comprised of m−1 stages to produce the codeword of a m-bit length, wherein an encoding for each stage k comprises:
    comparing an input $r_{k+1}$ to the stage k with two corresponding consecutive elements of the Fibonacci sequence $f_{k+1}$ and $f_k$;
    assigning a value of 1 to an output $d_k$ of the stage k, if $r_{k+1} \geq f_{k+1}$;
    assigning a value of 0 to the output $d_k$ of the stage k, if $r_{k+1} > f_k$; and otherwise
    assigning a value of an output $d_{k+1}$ of previous stage k+1 to the output $d_k$.

11. The method of claim 10, wherein the encoding for each stage k further comprises:
    sending a remainder $r_k$ of the encoding for the stage k as an input to a following stage k−1.

12. The method of claim 10, wherein the output $d_k$ of a most significant bit stage k equals to a most significant bit of the dataword.

13. The method of claim 9, further comprising:
    shifting values of the selected codeword by $f_{m+1}$ to remove the values redundancy in a gray region.

14. An apparatus for reducing crosstalk in a bus while transmitting a dataword over the bus, comprising:
    an encoder, in which the encoder is configured to encode a dataword, such that the dataword is represented as a Fibonacci forbidden pattern free (FPF) codeword when the code word is transmitted via a plurality of adjacent lines of the bus while eliminating crosstalk on all of the plurality of lines, and wherein values of the FPF codeword are shifted by $f_{m+1}$ to remove the values redundancy in a region where duplicated FPF Fibonacci vectors exist wherein fm is the $m^{th}$ element in the Fibonacci sequence.

15. The apparatus of claim 14, further comprising:
    a decoder, the decoder configured to decode the codeword to recover the dataword; and
    means for transmitting the codeword from the encoder to the decoder.

* * * * *